United States Patent
Suzuki et al.

(10) Patent No.: US 7,112,370 B2
(45) Date of Patent: Sep. 26, 2006

(54) VAPOR-DEPOSITED FILM

(75) Inventors: Hiroshi Suzuki, Tokyo (JP); Takeshi Kanetaka, Tokyo (JP); Miki Oohashi, Tokyo (JP); Noboru Sasaki, Tokyo (JP); Takayuki Nakajima, Tokyo (JP); Ryoji Ishii, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 0 days.

(21) Appl. No.: 10/760,483

(22) Filed: Jan. 21, 2004

(65) Prior Publication Data

US 2004/0166322 A1    Aug. 26, 2004

Related U.S. Application Data

(63) Continuation of application No. PCT/JP02/07432, filed on Jul. 23, 2002.

(30) Foreign Application Priority Data

Jul. 24, 2001    (JP) .............................. 2001-222717

(51) Int. Cl.
  *B32B 18/00*    (2006.01)
  *B32B 27/00*    (2006.01)
(52) U.S. Cl. ................... 428/412; 428/425.9; 428/447; 428/451; 428/477.7; 428/480; 428/521; 428/522; 428/523; 428/532
(58) Field of Classification Search ............ 428/411.1, 428/412, 425.9, 447, 451, 477.7, 480, 521, 428/522, 523, 532
See application file for complete search history.

(56) References Cited

U.S. PATENT DOCUMENTS

| | | | | |
|---|---|---|---|---|
| 5,589,252 A | | 12/1996 | Matsuo et al. | 428/216 |
| 5,645,923 A | * | 7/1997 | Matsuo et al. | 428/216 |
| 5,935,662 A | * | 8/1999 | Woolley et al. | 427/535 |
| 6,106,933 A | * | 8/2000 | Nagai et al. | 428/212 |
| 6,706,412 B1 | * | 3/2004 | Yializis | 428/463 |

FOREIGN PATENT DOCUMENTS

| | | |
|---|---|---|
| JP | 3-285061 | 12/1991 |
| JP | 5-287498 | 11/1993 |
| JP | 2000-52475 | 2/2000 |
| JP | 2001-88239 | 4/2001 |

OTHER PUBLICATIONS

Translation of PCT International Preliminary Examination Report for International Application No. PCT/JP02/07432. International Filing Date Jul. 23, 2002 (3 pgs.).

* cited by examiner

*Primary Examiner*—D. S. Nakarani

(57)    ABSTRACT

A vapor-deposited film having a substrate consisting essentially of a polymer material and a vapor-deposited layer consisting essentially of a ceramic, the substrate being subjected to plasma pre-treatment using a hollow anode plasma treatment device, prior to vapor deposition of the vapor-deposited layer.

21 Claims, 2 Drawing Sheets

VAPOR-DEPOSITED FILM

CROSS-REFERENCE TO RELATED APPLICATIONS

This is a Continuation Application of PCT Application No. PCT/JP02/07432, filed Jul. 23, 2002, which was not published under PCT Article 21(2) in English.

This application is based upon and claims the benefit of priority from the prior Japanese Patent Application No. 2001-222717, filed Jul. 24, 2001, the entire contents of which are incorporated herein by reference.

BACKGROUND OF THE INVENTION

1. Field of the Invention

The present invention relates to a vapor-deposited film performing a gas barrier function and used for packaging technique, for example, foodstuff, medicines, or precision electronic parts.

2. Description of the Related Art

A packaging material for packaging foodstuff, medicines, precision electronic parts, etc. is required to perform a sufficient gas barrier function.

In order to suppress the change of properties of the packaged material, a packaging material performing a gas barrier function is capable of preventing oxygen, water vapor, etc. permeating through the packaging material so as to prevent the effects of the gaseous material deteriorating the packaged contents. Where, for example, foodstuff is packaged by the packaging material performing the gas barrier function, the capability of shutting off oxygen, water vapor, etc. noted above is intended to suppress the oxidation and change of properties of proteins as well as fats and oils and to maintain the taste and the freshness of the packaged foodstuff. Where medicines are packaged by the particular packaging material, the capability is intended to maintain the sterility, to suppress the change of properties of the effective components and to maintain the performance. Further, where precision electronic parts are packaged by the particular packaging material, the capability is intended to prevent the corrosion of the metal portion and to prevent defective insulation.

Known packaging materials performing a gas barrier function include, for example, a packaging film using a polymer resin composition said to have a relatively high gas barrier function, such as a polypropylene film (KOP) coated with vinylidene chloride resin, a polyethylene terephthalate (KPET) film coated with vinylidene chloride resin and an ethylene-vinyl alcohol copolymer (EVOH) film; a foil of a metal such as aluminum or a foil of a metal compound; and a metal vapor-deposited film prepared by vapor deposition of a metal such as aluminum or a metal compound on a suitable polymer resin composition, even if the resin composition itself, when used singly, does not perform a high gas barrier function.

The packaging film using the polymer resin composition noted above is inferior in its gas barrier function to the foil using a metal such as aluminum or a metal compound, and to the metal vapor-deposited film prepared by forming a vapor-deposited film of a metal or a metal compound. Also, the packaging material using the polymer resin composition is likely to be affected by temperature and humidity, and the gas barrier function of the particular packaging material is likely to be further deteriorated by a change in temperature or humidity.

On the other hand, the foil made of a metal such as aluminum or a metal compound and the metal vapor-deposited film prepared by forming a vapor deposition layer are less likely to be affected by the temperature and the humidity so as to produce an excellent gas barrier function. However, the foil and the metal vapor-deposited film noted above are defective in that it is impossible to visually confirm the packaged material through the foil or the metal vapor-deposited film.

Under the circumstances, a vapor-deposited film prepared by forming a ceramic thin film made of, for example, a metal oxide and a silicon oxide on a substrate consisting essentially of a polymer material having a transparency has been put on the market as a packaging material satisfying both the gas barrier function and the transparency.

Aluminum oxide attracts a lot of attention as a material of the ceramic thin film because of the low cost of the raw material and the transparency.

However, a film prepared by forming an aluminum oxide film by the vapor deposition is low in the adhesion of the vapor-deposited film to the substrate so as to give rise to the defect that, if a treatment such as a retort treatment is applied, delamination is brought about.

Also, it has been attempted to date to improve the adhesion of the metal oxide vapor deposition layer on a plastic substrate by applying an in-line pretreatment using a plasma. However, in the case of using the conventional plasma generating apparatus, it is impossible to obtain a high treating effect, leading to a high cost.

Among the plasma generating apparatus, an apparatus of a DC discharge system certainly permits generating plasma easily. However, if it is intended to obtain a high bias voltage, the plasma mode is changed from the glow into the arc, giving rise to the problem that a strong treatment cannot be applied to a large area.

Also, a plasma generating apparatus of a high frequency discharge system, which certainly permits generating a stable plasma over a large area, is defective in that a high self bias voltage cannot be expected.

The present invention, which has been achieved in view of the situation described above, provides a vapor-deposited film prepared by forming by vapor deposition a ceramic thin film made of, for example, a metal oxide or a silicon oxide on a substrate consisting essentially of a polymer material having a transparency and is intended to strengthen the adhesion of the vapor-deposited film to the substrate so as to prevent the delamination caused by the treatment such as the retort treatment.

BRIEF SUMMARY OF THE INVENTION

According to a first aspect of the present invention, there is provided a vapor-deposited film comprising a substrate consisting essentially of a polymer material and a vapor deposition layer formed on the substrate and consisting essentially of a ceramic material, it is characterized in that the substrate is subjected to a plasma pretreatment by a special plasma using a hollow anode plasma processing apparatus before formation of the vapor deposition layer on the substrate.

According to a second aspect of the present invention, there is provided a vapor-deposited film comprising a substrate consisting essentially of a polymer material and a vapor deposition layer formed on the substrate and consisting essentially of aluminum oxide, it is characterized in that the substrate is subjected to a plasma pretreatment before formation of the vapor deposition layer on the substrate and that the aluminum oxide layer formed by the vapor deposition has a gradient structure in terms of an atomic ratio of aluminum to oxygen from the side in contact with the substrate toward the surface of the aluminum oxide layer.

DETAILED DESCRIPTION OF THE INVENTION

Figure 1:
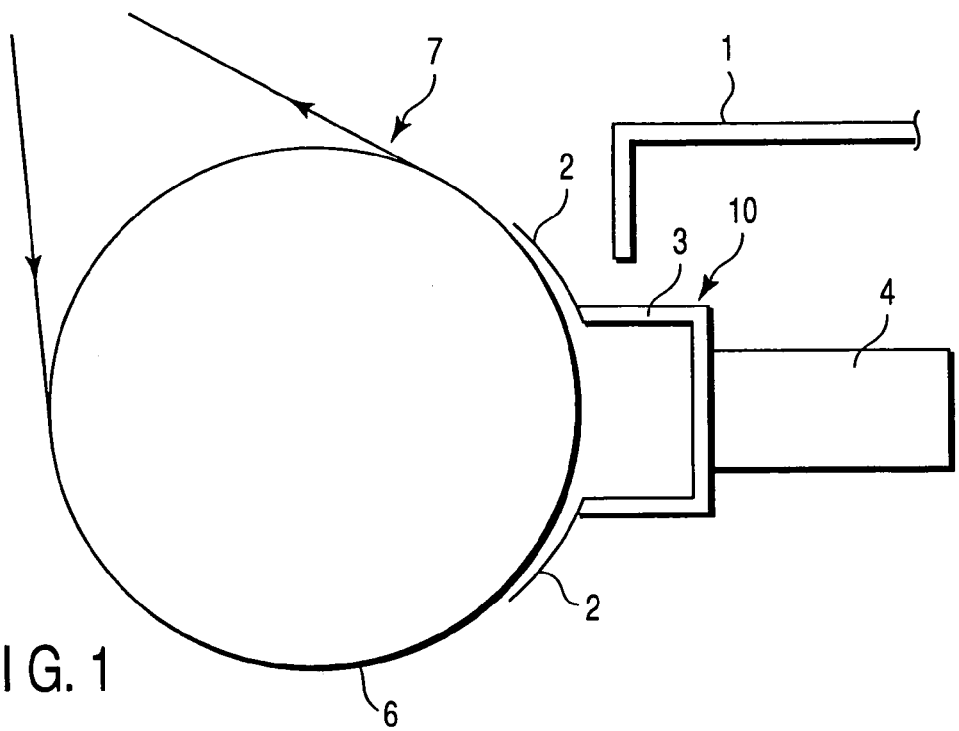
FIG. 1 schematically shows the construction of an example of a hollow anode plasma processing apparatus used in the present invention.

The vapor-deposited film according to a first aspect of the present invention comprises a substrate consisting essentially of a polymer material and a vapor deposition layer formed on the substrate and consisting essentially of a ceramic material and is featured in that the substrate is subjected to a plasma pretreatment by a special plasma using a hollow anode plasma processing apparatus before formation of the vapor deposition layer on the substrate.

The hollow anode includes an electrode shaped like a hollow box. The hollow electrode is rendered large relative to a counter electrode, e.g., a take-up drum supporting a substrate film, so as to use the life electrode as an anode. The hollow anode of the particular construction permits obtaining a high self bias value, compared with the ordinary plasma generating apparatus.

According to the present invention, a hollow anode plasma processing apparatus is used so as to obtain a high self bias value in the counter electrode, thereby making it possible to apply a stable and powerful plasma pretreatment to the substrate surface. As a result, a surface having an activity is formed. The surface of the substrate having an activity has a high affinity with the ceramic vapor deposition layer formed on the substrate so as to improve the adhesion of the ceramic vapor deposition layer to the substrate. It follows that the technology of the present invention permits preventing the delamination caused by, for example, the retort treatment with using the vapor-deposited film.

A preferred example of the vapor-deposited film of the present invention comprises a substrate consisting essentially of a polymer material and a vapor deposition layer formed on the substrate and consisting essentially of a ceramic material. The substrate is subjected to a plasma pretreatment by a special plasma using a magnetic assisted hollow anode plasma processing apparatus.

The magnetic assisted hollow anode plasma processing apparatus preferably used in the present invention is a processing apparatus incorporating a magnet such as a permanent magnet or an electromagnet in the anode of the ordinary hollow anode plasma processing apparatus. Preferably, a hollow anode type AC discharge is used in the present invention. In the magnetic assisted hollow anode plasma processing apparatus, the generated plasma is confined in the processing apparatus by the magnetism, therefore the plasma has a high density. It is thus possible to generate a self bias larger than that in the case of using the ordinary hollow anode plasma processing apparatus so as to obtain a high ion current density. Therefore, it is possible to carry out a powerful and faster stable plasma processing.

This high density plasma can be applied to a substrate surface by using the magnetic assisted hollow anode plasma processing apparatus of the present invention. As a result, a crosslinking structure is introduced into the substrate surface so as to form a strong substrate surface, thereby proving a surface having a higher activity. A high activity has a high affinity with the ceramic vapor deposition layer formed on the substrate, thereby markedly improving the adhesion of the ceramic vapor deposition layer to the substrate. It follows that the technology of the present invention makes it possible to prevent delamination caused by, for example, the retort of the vapor-deposited film.

FIG. 1 schematically shows the construction of an example of the hollow anode plasma processing apparatus used in the present invention.

As shown in the drawing, the hollow anode plasma processing apparatus comprises a matching box 4 arranged within, for example, a vacuum chamber for matching the impedance, a hollow box electrode 3 connected to the matching box 4, a shield plate 2 arranged to extend from the edge portion of the electrode 3, an inlet portion 1 for introducing a plasma gas, a process chamber 10, and a cooling drum 6 arranged to the counter electrode of the electrode 3 and supporting a substrate material 7.

In the processing apparatus, the electrode 3 is used as an anode, and the area (Sa) of the anode is set larger than the area (Sc) of the substrate forming the counter electrode, i.e., Sa>Sc. By making large the area of the hollow box-shaped electrode, it is possible to generate a large self bias on the cathode providing the counter electrode, i.e., on the substrate material.

The large self bias noted above makes it possible to apply a plasma processing to the substrate material 7 with a high ion density so as to realize a stable and powerful plasma surface processing at a high speed.

Figure 2:
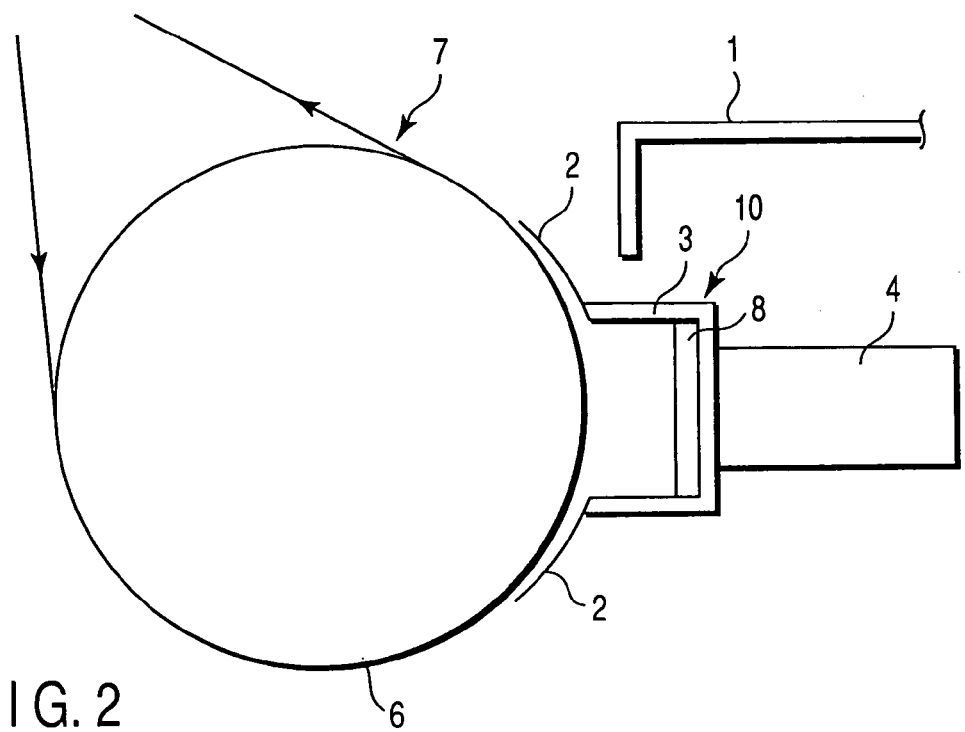
FIG. 2 schematically shows the construction of an example of a magnetic assisted hollow anode plasma processing apparatus preferably used in the present invention.

FIG. 2 schematically shows the construction of an example of the magnetic assisted hollow anode plasma processing apparatus preferably used in the present invention.

As apparent from FIG. 2, the magnetic assisted hollow anode plasma processing apparatus is equal in construction to the apparatus shown in FIG. 1, except that the apparatus shown in FIG. 2 further comprises a permanent magnet 8 in the bottom portion of the electrode 3.

By further arranging, for example, a permanent magnet in the electrode 3, the plasma generated in the vicinity of the electrode 3 can be confined within the box-shaped electrode 3 by the function of the permanent magnet, with the result that it is possible to generate a larger self bias on the cathode providing the counter electrode, i.e., on the substrate material.

The large self bias thus generated makes it possible to apply a plasma processing to the substrate material 7 with a high ion density so as to realize a stable and more powerful plasma surface processing with a higher speed.

Figure 3:
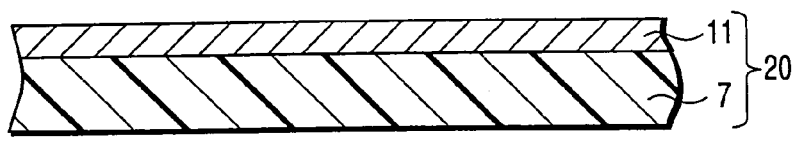
FIG. 3 is a cross sectional view showing the construction of an example of a vapor-deposited film of the present invention.

FIG. 3 is a cross sectional view exemplifying the construction of a vapor-deposited film 20 prepared by forming a ceramic vapor-deposited film on the substrate material 7, which was subjected to a plasma pretreatment by using a hollow anode plasma processing apparatus.

As shown in FIG. 3, the vapor-deposited film 20 comprises a transparent film substrate 7 and a ceramic vapor deposition layer 11 formed by vapor deposition on the substrate 7 and having a thickness of, for example, 5 to 300 nm.

It is desirable for the ceramic material used in the present invention to be at least one inorganic oxide selected from the group consisting of aluminum oxide, silicon monoxide, magnesium oxide and calcium oxide. These inorganic oxides are high in safety, relatively low in cost, transparent and perform a sufficient barrier function. Silicon oxide has a color thus, cannot provide a high transparency. On the other hand, magnesium oxide and calcium oxide, which have a high sublimation temperature, have a low evaporation rate in the vapor deposition process and, thus, require a long film-forming time.

Under the circumstances, it is more desirable to use aluminum oxide as the ceramic material.

It is desirable for the thickness of the vapor deposition layer to fall between 5 nm and 300 nm. If the thickness of the vapor deposition layer is less than 5 nm, it is difficult to obtain a uniform vapor deposition layer, with the result that it is difficult to obtain a sufficient gas barrier function. On the other hand, if the thickness of the vapor deposition layer exceeds 300 nm, it is difficult to obtain a sufficient resistance to a folding stress or tensile stress, i.e. the flexibility is low. Also, the peeling strength of the vapor deposition layer is lowered, with the result that delamination tends to take place easily at the retort stage.

It is desirable for the aluminum oxide layer to have a gradient structure in terms of the atomic ratio of aluminum to oxygen such that the atomic ratio of aluminum to oxygen is consecutively changed within a range of 1:2 to 1:1 from the inner surface in contact with the substrate toward the outer surface. This makes it possible to develop a satisfactory barrier function while maintaining transparency. It also produces an additional advantage that the adhesion of the vapor deposition layer to the substrate can be further improved.

It is desirable for the plasma pretreatment employed in the present invention to be a low temperature processing.

It is desirable to use at least one kind of plasma gas species selected from the group consisting of argon, nitrogen, oxygen and hydrogen.

Also, it is desirable for the self bias value on the substrate to be between 200V and 2,000V.

If the self bias value on the substrate is less than 200V, the processing on the substrate tends to be insufficient. On the other hand, if the self bias exceeds 2,000V, the generated plasma itself tends to be rendered unstable.

Also, in the plasma pretreatment, it is desirable to use a low temperature plasma having an Ed value, i.e., the value of the product Ed of the plasma density and the processing time, falling within between $100V \cdot s \cdot m^{-2}$ and $10,000V \cdot s \cdot m^{-2}$. If the Ed value is less than $100V \cdot s \cdot m^{-2}$, the adhesion tends to be rendered insufficient. On the other hand, if the Ed value exceeds $10,000V \cdot s \cdot m^{-2}$, the surface layer tends to be rendered brittle due to excessive processing.

Also, it is possible to employ as the plasma pretreatment a first processing step that is carried out using an inert gas, followed by a second processing step using at least one gas selected from the group consisting of nitrogen, oxygen, hydrogen, and a mixture thereof. It is possible to use argon, helium, or both as the inert gas.

Alternatively, it is possible to employ as the plasma pretreatment a first processing using a mixture of nitrogen and oxygen, followed by a second processing using hydrogen.

Incidentally, it is desirable to set appropriately the plasma gas species, the mixing ratio thereof, etc. in accordance with the use, the substrate material and the characteristics of the apparatus, because the inlet portion and the effective portion differ from each other in the flow rate of the plasma gas species depending on, for example, the pump performance of the apparatus and the mounting position of the gas inlet portion.

The vapor-deposited film according to a second aspect of the present invention comprises a substrate consisting essentially of a polymer material and a vapor deposition layer formed on the substrate and consisting essentially of aluminum oxide. The substrate is subjected to a plasma pretreatment before formation of the vapor deposition layer on the substrate. On the other hand, the vapor deposition layer has a gradient structure in terms of the atomic ratio of aluminum to oxygen such that the atomic ratio is changed from the side in contact with the substrate toward the surface of the vapor deposition layer.

In the vapor-deposited film according to the second aspect of the present invention, it is desirable for the atomic ratio of aluminum to oxygen to be changed gradually within a range of 1:2 to 1:1 from the side in contact with the substrate toward the film surface.

In the vapor-deposited film according to the second aspect of the present invention, it is possible to employ a high frequency plasma for the plasma pretreatment.

In the present invention according to the second aspect, a plasma pretreatment is applied to the substrate so as to modify the surface of the substrate, to improve the adhesion of the vapor deposition layer to the substrate, and to form as a vapor deposition layer an aluminum oxide layer having a gradient structure in terms of the atomic ratio of aluminum to oxygen. As a result, it is possible to obtain a vapor-deposited film, in which a good adhesion is achieved between the substrate and the vapor deposition layer and delamination is unlikely to be generated by, for example, the retort, and which exhibits a sufficient transparency and a high gas barrier function.

Further, if a mixed gas containing hydrogen and nitrogen is used as the plasma gas species, a large number of amino groups are formed on the surface of the substrate subjected to the plasma pretreatment, thereby providing a surface of higher activity. As a result, the affinity between the substrate surface and the vapor deposition layer is improved so as to further improve the bond of adhesion between the substrate and the vapor deposition layer. It is preferable for the atomic ratio of the hydrogen gas to the nitrogen gas in mixed gas providing the plasma gas species to fall within a range of between 1:2 and 2:1.

It is desirable for the substrate used in the present invention, which consists essentially of a polymer material, to be transparent. To be more specific, it is desirable to use the material, which is generally used as the packaging material, for forming the substrate. Also, it is desirable for the substrate material to have a high mechanical strength and a high dimensional stability such that the substrate material can be processed to form a film. Further, it is desirable for the substrate material to be excellent in smoothness and small in the amount of additives.

It is possible to use as the polymer material at least one kind of polymer selected from the group consisting of polyethylene, polypropylene, polyamides, polyesters, polycarbonate, polyacrylonitrile, polystyrene, polyvinyl chloride, cellulose, triacetyl cellulose, polyvinyl alcohol, polyurethanes, and polymers having chemically modified bodies of these polymers.

The polyesters used in the present invention include, for example, polyethylene terephthalate, polyethylene naphthalate, polybutylene terephthalate, polybutylene naphthalate, and copolymers thereof.

More desirably, the polymer material used in the present invention includes, for example, polyethylene terephthalate (PET), a biaxially oriented polypropylene (OPP), and a biaxially oriented nylon ($ON_y$).

It is desirable for the thickness of the substrate, which is not particularly limited in the present invention, to fall within a range of between 5 µm and 100 µm in view of, for example, the suitability for the packaging material and the difference in the processing in the step of forming the vapor deposition layer.

In view of the mass production capability, it is desirable for the substrate to be in the form of a large film so as to permit consecutively forming a thin film. Also, a composite film can be formed on the vapor deposition layer.

Figure 4:
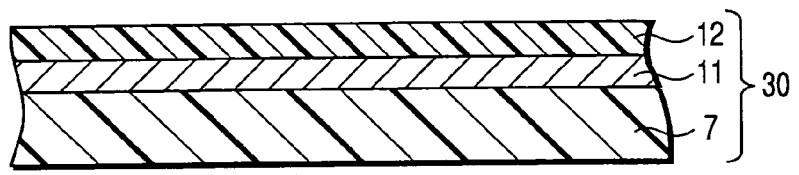
FIG. 4 is a cross sectional view showing the construction of another example of a vapor-deposited film of the present invention.

FIG. 4 is a cross sectional view showing the construction of another example of a vapor-deposited film 30 of the present invention.

As shown in FIG. 4, the vapor-deposited film 30 includes a transparent film substrate 7, a transparent ceramic vapor deposition layer 11 formed on the transparent film substrate 7 and having a thickness of, for example, 5 nm to 300 nm, and a composite covering layer 12 formed on the ceramic vapor deposition layer 11 and consisting essentially of a material of, for example, the hydrogen radical-containing polymer compound referred to above.

If the composite film noted above is formed, the adhesion, the gas barrier function and the printing adaptability are further improved so as to protect the vapor deposition layer.

Incidentally, in the laminated film shown in each of FIGS. 3 and 4, the transparent ceramic vapor-deposited film 11 and the composite covering layer 12 performing the gas barrier function are formed on one surface of the substrate. However, it is possible to form the transparent ceramic vapor deposition layer 11 and the composite covering layer 12 on both surfaces of the substrate 2. It is also possible to laminate repeatedly the transparent ceramic vapor deposition layer 11 and the composite covering layer 12 to form a multi-layered structure.

The materials of the composite covering layer include, for example, a hydroxyl group-containing polymer compound, a metal alkoxide, a hydrolysate thereof and a polymer thereof.

The hydroxyl radical-containing polymer compound used in the present invention includes, for example, polyvinyl alcohol, poly(vinyl alcohol-co-ethylene), cellulose and starch.

Particularly, polyvinyl alcohol is easy to handle and excellent in its gas barrier function, though the hydroxyl group-containing polymer compound used in the present invention is not limited to polyvinyl alcohol.

It is possible to use at least one of a silane alkoxide and a silane coupling agent as the metal alkoxide.

It is desirable to use an alkoxide of silicon in view of the handling properties and the cost. Alternatively, the metal alkoxide used in the present invention is not limited to the saturated alkoxide and it is possible to use an organic or inorganic composite body such as a so-called "silane coupling agent" having each functional group, if flexibility of the covering layer and adhesion need to be improved.

Incidentally, it is desirable to carry out successively the plasma pretreatment and the vapor deposition for forming the vapor deposition layer within the same film-forming apparatus without breaking the vacuum. This enables a good production efficiency, and prevents contamination of the substrate surface by air, after plasma processing.

The vapor deposition method employed in the present invention for forming the vapor deposition layer includes, for example, reactive vapor deposition, reactive sputtering and reactive ion plating. In any of these, a thin film is formed by using the elements of the ceramic raw material in the presence of a mixed gas of, for example, oxygen, carbon dioxide and an inert gas.

The method described above can be put into practice easily by using a film-forming apparatus of a simple construction and, thus, is desirable in terms of productivity. However, the above method of forming a vapor deposition layer is not limited.

Figure 5:
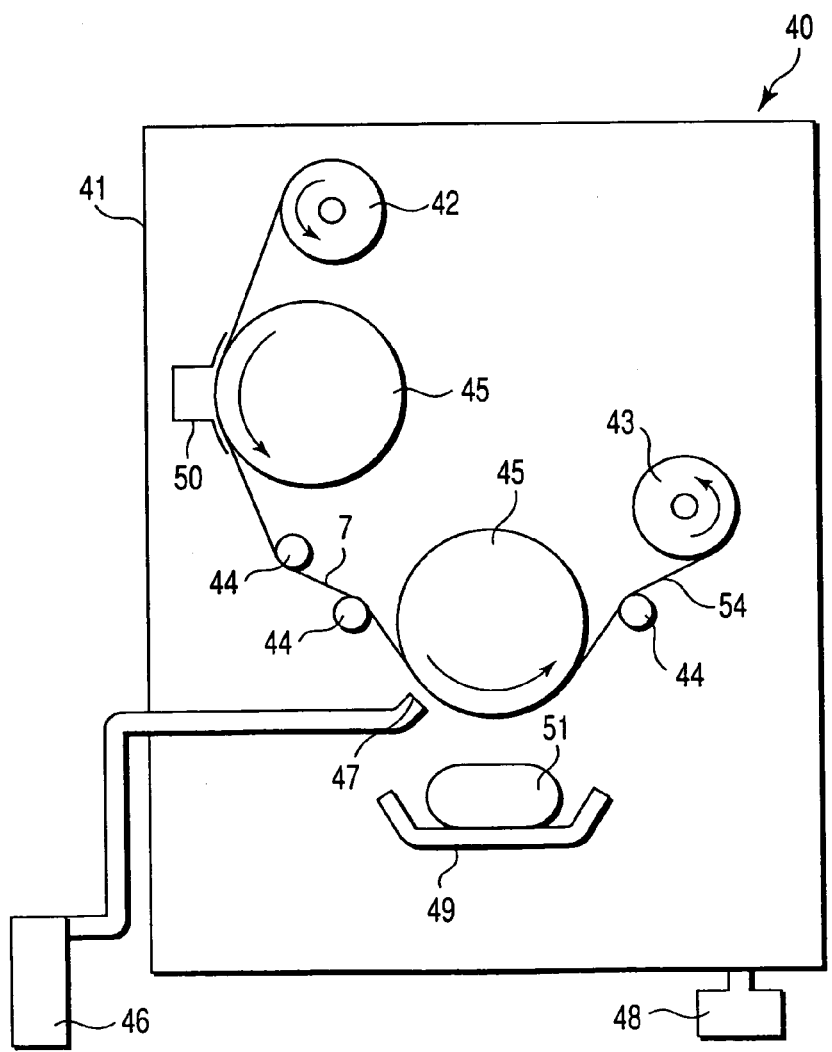
FIG. 5 schematically shows the construction of an example of a film-forming apparatus that can be used in the present invention.

FIG. 5 schematically shows the construction of an example of a film-forming apparatus 40 that can be used in the present invention. As shown in the drawing, the film-forming apparatus 40 includes a vacuum chamber 41, a forward section 42 arranged within the vacuum chamber 41 for supplying a substrate material 7, a plasma processing apparatus 50 arranged downstream of the forward section 42 and constructed as shown in, for example, FIG. 1, a cooling drum 45 supporting the substrate material 7 on which is formed a vapor deposition layer so as to cool the substrate material 7, a take-up section 43 for taking up the substrate material 7, guide rollers 44 arranged between the plasma processing section 50 and the take-up section 43 for transferring the substrate material 7, a cooling drum 45, a crucible 49 arranged to face the cooling drum 45 with the substrate material 7 interposed therebetween for disposing the source of the vapor deposition thereon, a vapor deposition source 51 housed in the crucible 49, a gas supply section 46 for supplying a reactant gas between the substrate material 7 and the vapor deposition source 51, a gas supply port 47, and a vacuum pump 48 for setting up a vacuum condition within the vacuum chamber 41.

In the apparatus described above, the substrate material 7 is mounted to the forward section 42 of the film-forming apparatus 40, and a vapor deposition source of, for example, aluminum is arranged in the crucible 49. Then, a vacuum of $1.3 \times 10^{-2}$ Pa to $13 \times 10^{-2}$ Pa is set up within the vacuum chamber 41 by operating the vacuum pump 48, followed by evaporating the aluminum vapor deposition source 51 within the crucible 49 by the heating of an electron beam heating system while transferring the substrate material 7 from the forward section 42 to the take-up section 43 through the guide rolls 44. At the same time, an oxygen gas is supplied from the oxygen gas supply port 47 into the aluminum vapor atmosphere so as to carry out the reaction between the oxygen gas and the aluminum gas, thereby forming an aluminum oxide layer on the substrate material 7. In this case, the oxygen gas supply port 47 is positioned upstream of the crucible 49 in the moving direction of the substrate material. As a result, aluminum oxide having a high oxygen atom ratio is formed on the side of the front surface of the substrate material 7, thereby obtaining an aluminum oxide vapor deposition layer having a gradient structure in terms of the atomic ratio of oxygen to aluminum.

The present invention will now be described more in detail with reference to Examples of the present invention.

EXAMPLE 1

Prepared as a substrate was a long transparent polyethylene terephthalate film having a thickness of 12 μm.

Then, the polyethylene terephthalate film was introduced into the high frequency plasma processing apparatus of the film-forming apparatus shown in FIG. 5, and a low temperature plasma processing was applied to the polyethylene terephthalate film using a high frequency plasma under an input power of 120 W and a self bias of 120V. A plasma pretreatment with argon was applied.

In the next step, the substrate material subjected to the plasma pretreatment was introduced into the vacuum deposition apparatus, and an aluminum oxide vapor deposition layer having a gradient structure, in which the atomic ratio of aluminum to oxygen was consecutively changed within a range of 1:2 to 1:1.2 from the substrate side toward the surface of the vapor deposition layer, was formed in a thickness of about 20 nm on one surface of the substrate material by reaction vapor deposition using an electron beam heating system, while supplying oxygen at a flow rate of 1,500 sccm with aluminum used as a vapor deposition source. The vapor deposition layer thus obtained exhibited a satisfactory transparency.

The oxygen permeability and the water vapor permeability were measured immediately after the vapor deposition, with the results as shown in Table 1.

Also, a composite covering layer performing a gas barrier function was formed on the vapor deposition layer as follows.

Prepared as a first solution was a hydrolyzate solution containing 3% by weight of a solid component in terms of $SiO_2$ by adding 89.6 g (0.1 N) of hydrochloric acid to 10.4 g of tetramethoxy silane and stirring the solution for 30 minutes so as to achieve hydrolysis.

Then, a second solution was prepared by mixing 97% by weight of a water-isopropyl alcohol solution consisting of 90 parts by weight of water and 10 parts by weight of isopropyl alcohol with 3% by weight of polyvinyl alcohol.

The first solution noted above was mixed with the second solution noted above at a mixing ratio by weight of 60:40 so as to obtain coating solution 1.

Coating solution 1 was coated by a gravure coating method, followed by drying the coating at 120° C. for one minute so as to obtain a composite covering layer having a thickness of 500 nm and performing the gas barrier function.

Further, a dry lamination was applied to the composite covering layer performing the gas barrier function with an adhesive for the dry lamination interposed therebetween so as to convert a laminate structure consisting of the vapor-deposited film, the oriented nylon film having a thickness of 15 μm and the not oriented-polypropylene film having a thickness of 70 μm to the composite covering layer, thereby obtaining a final vapor-deposited film.

A retort treatment was applied to the vapor-deposited film thus obtained at 121° C. for 30 minutes so as to measure the oxygen permeability and the mechanical strength of the laminate structure.

The mechanical strength of the laminate structure was measured by the method specified in JIS Z 1707 by using a peel tester, i.e., Tensilon universal tester RTC-1250 manufactured by Orientec Inc. To be more specific, the measuring portion was swollen by water and the mechanical strength of the laminate structure was measured as a severe test. Table 2 shows the results.

Incidentally, the oxygen permeability was measured immediately after the vapor deposition and coating of each film at 30° C. and under an RH atmosphere of 70% by using MONOCON OXTRAN 10/50A manufactured by Modern Control Inc.

Also, the initial water vapor permeability was measured immediately after the vapor deposition and coating of each film at 40° C. and under an RH atmosphere of 90% by using MONOCON PERMATRAN W6 manufactured by Modern Control Inc.

EXAMPLE 2

Prepared was a substrate equal to that used in Example 1, and the substrate thus prepared was introduced into an ordinary hollow anode plasma processing apparatus so as to carry out a low temperature plasma processing under an input power of 120 W and a self bias value of 320V with an argon gas used as a plasma gas species.

Then, an aluminum oxide layer was formed to a thickness of about 20 nm on one surface of the substrate, which had been subjected to the plasma processing, by the reaction vapor deposition using an electron beam heating system, while flowing oxygen at a rate of 1,500 sccm.

The vapor deposition layer thus obtained exhibited a satisfactory transparency.

The tests used in Example 1 were applied to the obtained vapor-deposited film. Tables 1 and 2 show the results.

EXAMPLE 3

Prepared was a substrate equal to that used in Example 1, and the substrate thus prepared was introduced into a magnetic assisted hollow anode plasma processing apparatus constructed as shown in FIG. 1 so as to carry out a low temperature plasma processing under an input power of 120 W and a self bias of 360V with argon used as a plasma gas species.

Then, an aluminum oxide layer was formed to a thickness of about 20 nm on one surface of the substrate, which had been subjected to the plasma processing, by the reaction vapor deposition using an electron beam heating system, as in Example 2.

The vapor deposition layer thus obtained exhibited a satisfactory transparency.

The tests used in Example 1 were applied to the obtained vapor-deposited film. Tables 1 and 2 show the results.

EXAMPLE 4

Prepared was a substrate equal to that used in Example 1, and the substrate thus prepared was introduced into an ordinary hollow anode plasma processing apparatus so as to carry out a low temperature plasma processing under an input power of 120 W and a self bias of 330V with argon used as a plasma gas species. Further, an aluminum oxide vapor deposition layer having a gradient structure in terms of the atomic ratio of aluminum to oxygen was formed to a thickness of about 20 nm on one surface of the substrate as in Example 1. The aluminum oxide vapor deposition layer had a gradient structure in terms of the atomic ratio of aluminum to oxygen such that the atomic ratio of aluminum to oxygen was consecutively changed within a range of 1:2 to 1:1.2 from the substrate side toward the surface of the vapor deposition layer.

The vapor deposition layer thus obtained exhibited a satisfactory transparency.

The tests equal to those in Example 1 were applied to the obtained vapor-deposited film. Tables 1 and 2 show the results.

EXAMPLE 5

Prepared was a substrate equal to that used in Example 1, and the substrate thus prepared was introduced into a magnetic assisted hollow anode plasma processing apparatus constructed as shown in FIG. 1 so as to carry out a low temperature plasma processing under an input power of 120 W and a self bias of 360V with argon used as a plasma gas species. Further, an aluminum oxide vapor deposition layer having a gradient structure in terms of the atomic ratio of aluminum to oxygen was formed in a thickness of about 20 nm on one surface of the substrate as in Example 1. The aluminum oxide vapor deposition layer had a gradient structure in terms of the atomic ratio of aluminum to oxygen such that the atomic ratio of aluminum to oxygen was consecutively changed within a range of 1:2 to 1:1.2 from the substrate side toward the surface of the vapor deposition layer.

The vapor deposition layer thus obtained exhibited a satisfactory transparency.

The tests equal to those in Example 1 were applied to the obtained vapor-deposited film. Tables 1 and 2 show the results.

EXAMPLE 6

Prepared was a substrate equal to that used in Example 1, and the substrate thus prepared was introduced into two magnetic assisted hollow anode plasma processing apparatuses each constructed as shown in FIG. 1. A low temperature plasma processing was performed first in one of these magnetic assisted hollow anode plasma processing apparatuses under an input power of 120 W and a self bias of 300V with argon used as a plasma gas species. Further, a low temperature plasma processing was performed in the other magnetic assisted hollow anode plasma processing apparatuses under an input power of 120 W and a self bias of 300V with oxygen used as a plasma gas species.

Further, an aluminum oxide layer was formed in a thickness of about 20 nm on one surface of the substrate, which had been subjected to the plasma processing, as in Example 2.

The vapor deposition layer thus obtained exhibited a satisfactory transparency.

The tests equal to those in Example 1 were applied to the obtained vapor-deposited film. Tables 1 and 2 show the results.

EXAMPLE 7

Prepared was a substrate equal to that used in Example 1, and the substrate thus prepared was introduced into two magnetic assisted hollow anode plasma processing apparatuses each constructed as shown in FIG. 1. A low temperature plasma processing was performed first in one of these magnetic assisted hollow anode plasma processing apparatuses under an input power of 120 W and a self bias value of 320V with an argon gas used as a plasma gas species. Further, a low temperature plasma processing was performed in the other magnetic assisted hollow anode plasma processing apparatuses under an input power of 120 W and a self bias of 300V with oxygen used as a plasma gas species.

Further, an aluminum oxide layer was formed to a thickness of about 20 nm on one surface of the substrate, which had been subjected to the plasma processing, as in Example 1. The aluminum oxide layer had a gradient structure in terms of the atomic ratio of aluminum to oxygen such that the atomic ratio of aluminum to oxygen was successively changed within a range of 1:2 to 1:1.2 from the side in contact with the substrate toward the surface of the aluminum oxide film.

The vapor deposition layer thus obtained exhibited a satisfactory transparency.

The tests equal to those in Example 1 were applied to the obtained vapor-deposited film. Tables 1 and 2 show the results.

EXAMPLE 8

Prepared was a substrate equal to that used in Example 1, and the substrate thus prepared was introduced into two magnetic assisted hollow anode plasma processing apparatuses each constructed as shown in FIG. 1. A low temperature plasma processing was performed first in one of these magnetic assisted hollow anode plasma processing apparatuses under an input power of 120 W and a self bias of 320V with nitrogen used as a plasma gas species. Further, a low temperature plasma processing was performed in the other magnetic assisted hollow anode plasma processing apparatuses under an input power of 120 W and a self bias of 320V with hydrogen used as a plasma gas species.

Further, an aluminum oxide layer was formed to a thickness of about 20 nm on one surface of the substrate, which had been subjected to the plasma processing, as in Example 2.

The vapor deposition layer thus obtained exhibited a satisfactory transparency.

The tests equal to those in Example 1 were applied to the obtained vapor-deposited film. Tables 1 and 2 show the results.

EXAMPLE 9

Prepared was a substrate equal to that used in Example 1, and the substrate thus prepared was introduced into two magnetic assisted hollow anode plasma processing apparatuses each constructed as shown in FIG. 1. A low temperature plasma processing was performed first in one of these magnetic assisted hollow anode plasma processing apparatuses under an input power of 120 W and a self bias of 320V with nitrogen used as a plasma gas species. Further, a low temperature plasma processing was performed in the other magnetic assisted hollow anode plasma processing apparatuses under an input power of 120 W and a self bias of 320V with hydrogen used as a plasma gas species.

Further, an aluminum oxide layer was formed to a thickness of about 20 nm on one surface of the substrate, which had been subjected to the plasma processing, as in Example 1. The aluminum oxide layer had a gradient structure in terms of the atomic ratio of aluminum to oxygen such that the atomic ratio of aluminum to oxygen was successively changed within a range of 1:2 to 1:1.2 from the side in contact with the substrate toward the surface of the aluminum oxide film.

The vapor deposition layer thus obtained exhibited a satisfactory transparency.

The tests equal to those in Example 1 were applied to the obtained vapor-deposited film. Tables 1 and 2 show the results.

COMPARATIVE EXAMPLE 1

A substrate was prepared as in Example 1, and an aluminum oxide layer was formed to a thickness of about 20 nm as in Example 2, except that a plasma processing was not applied in Comparative Example 1.

COMPARATIVE EXAMPLE 2

A substrate was prepared as in Example 1, and an aluminum oxide layer was formed to a thickness of about 20 nm on one surface of the substrate as in Example 1, except that a plasma processing was not applied in Comparative Example 2. The aluminum oxide layer had a gradient structure in terms of the atomic ratio of aluminum to oxygen such that the atomic ratio noted above was successively changed within a range of 1:2 to 1:1.2 from the side in contact with the substrate toward the surface of the aluminum oxide layer.

TABLE 1

|  | Self bias value V | Ed value V · sec/m$^2$ | Oxygen permeability ml/m$^2$ · day · MPa | Water vapor permeability g/m$^2$ · day |
|---|---|---|---|---|
| Example 1 | 120 | 214 | 20 | 1.8 |
| Example 2 | 320 | 214 | 26 | 2.8 |
| Example 3 | 360 | 214 | 29 | 2.6 |
| Example 4 | 330 | 214 | 19 | 1.5 |
| Example 5 | 360 | 214 | 18 | 1.6 |
| Example 6 | 300 | 214 | 28 | 2.5 |
| Example 7 | 300 | 214 | 18 | 1.6 |
| Example 8 | 320 | 214 | 29 | 2.8 |
| Example 9 | 320 | 214 | 21 | 1.6 |
| Comparative Example 1 | 0 | 0 | 31 | 2.9 |
| Comparative Example 2 | 0 | 0 | 30 | 2.8 |

TABLE 2

|  | Oxygen permeability ml/m$^2$ · day · MPa | Mechanical strength of laminate structure N/15 mm |
|---|---|---|
| Example 1 | 4.1 | 1.9 |
| Example 2 | 5.7 | 4.5 |
| Example 3 | 5.6 | 5.1 |
| Example 4 | 3.8 | 4.4 |
| Example 5 | 3.7 | 5.1 |
| Example 6 | 5.6 | 4.8 |
| Example 7 | 3.7 | 4.8 |
| Example 8 | 5.8 | 4.6 |
| Example 9 | 3.8 | 4.5 |
| Comparative Example 1 | 6.1 | 0.3 |
| Comparative Example 2 | 4.2 | 0.4 |

As apparent from Tables 1 and 2, the vapor-deposited film for each of Examples 1 to 8 of the present invention exhibits a high self bias value, is sufficiently low in each of the oxygen permeability and the water vapor permeability, and is satisfactory in each of the oxygen permeability and the mechanical strength of the laminate structure after the retort treatment. However, the vapor-deposited film of Comparative Examples 1 and 2 in which the plasma pretreatment was not performed was insufficient in all of the values noted above. Particularly, the mechanical strength of the laminate structure after the retort treatment was low in the vapor-deposited film for each of Comparative Examples 1 and 2.

EXAMPLE 10

A vapor-deposited film was obtained as in Example 2, except that a biaxially oriented nylon ($ON_y$) film having a thickness of 15 μm was used as the substrate, the atomic ratio of aluminum to oxygen of the vapor-deposited film was successively changed within a range of 1:2 to 1:1 from the side in contact with the substrate toward the surface of the vapor-deposited film, and a not oriented-polyethylene film having a thickness of 60 μm was subjected to convert to the composite covering layer in place of the laminate structure consisting of the oriented nylon film having a thickness of 15 μm and the not oriented polypropylene film having a thickness of 70 μm.

The vapor-deposited film thus obtained exhibited a satisfactory transparency. Also, the oxygen permeability and the mechanical strength of the laminate structure were measured in respect of the obtained vapor-deposited film. Table 3 shows the results.

EXAMPLE 11

A vapor-deposited film was obtained as in Example 2, except that a biaxially oriented nylon ($ON_y$) film having a thickness of 15 μm was used as the substrate, and a not oriented-polyethylene film having a thickness of 60 μm was subjected to convert to the composite covering layer the laminate structure consisting of the oriented nylon film having a thickness of 15 μm and the not oriented-polypropylene film having a thickness of 70 μm.

The vapor-deposited film thus obtained exhibited a satisfactory transparency. Also, the oxygen permeability and the mechanical strength of the laminate structure were measured in respect of the obtained vapor-deposited film. Table 3 shows the results.

EXAMPLE 12

A vapor-deposited film was obtained as in Example 3, except that a biaxially oriented nylon ($ON_y$) film having a thickness of 15 μm was used as the substrate, and a not oriented-polyethylene film having a thickness of 60 μm was subjected to convert in place of the laminate structure consisting of the oriented nylon film having a thickness of 15 μm and the not oriented polypropylene film having a thickness of 70 μm.

The vapor-deposited film thus obtained exhibited a satisfactory transparency. Also, the oxygen permeability and the mechanical strength of the laminate structure were measured in respect of the obtained vapor-deposited film. Table 3 shows the results.

EXAMPLE 13

A vapor-deposited film was obtained as in Example 4, except that a biaxially oriented nylon ($ON_y$) film having a thickness of 15 μm was used as the substrate, the atomic ratio of aluminum to oxygen of the vapor-deposited film was successively changed within a range of 1:2 to 1:1 from the side in contact with the substrate toward the surface of the vapor-deposited film, and a not oriented-polyethylene film having a thickness of 60 μm was subjected to convert to the laminated covering layer in place of the laminate structure consisting of the oriented nylon film having a thickness of 15 μm and the not oriented film having a thickness of 70 μm.

The vapor-deposited film thus obtained exhibited a satisfactory transparency. Also, the oxygen permeability and the mechanical strength of the laminate structure were measured in respect of the obtained vapor-deposited film. Table 3 shows the results.

EXAMPLE 14

A vapor-deposited film was obtained as in Example 5, except that a biaxially oriented nylon ($ON_y$) film having a thickness of 15 μm was used as the substrate, the atomic ratio of aluminum to oxygen of the vapor-deposited film was successively changed within a range of 1:2 to 1:1 from the side in contact with the substrate toward the surface of the vapor-deposited film, and a not oriented-polyethylene film having a thickness of 60 μm was subjected to the convert to the laminated covering layer in place of the laminate structure consisting of the oriented nylon film having a thickness of 15 μm and the not oriented-polypropylene film having a thickness of 70 μm.

The vapor-deposited film thus obtained exhibited a satisfactory transparency. Also, the oxygen permeability and the mechanical strength of the laminate structure were measured in respect of the obtained vapor-deposited film. Table 3 shows the results.

EXAMPLE 15

A vapor-deposited film was obtained as in Example 6, except that a biaxially oriented nylon ($ON_y$) film having a thickness of 15 μm was used as the substrate, and a not oriented-polyethylene film having a thickness of 60 μm was subjected to convert to the composite covering layer in place of the laminate structure consisting of the oriented nylon film having a thickness of 15 μm and the polypropylene film having a thickness of 70 μm.

The vapor-deposited film thus obtained exhibited a satisfactory transparency. Also, the oxygen permeability and the mechanical strength of the laminate structure were measured in respect of the obtained vapor-deposited film. Table 3 shows the results.

EXAMPLE 16

A vapor-deposited film was obtained as in Example 7, except that a biaxially oriented nylon ($ON_y$) film having a thickness of 15 μm was used as the substrate, the atomic ratio of aluminum to oxygen of the vapor-deposited film was successively changed within a range of 1:2 to 1:1 from the side in contact with the substrate toward the surface of the vapor-deposited film, and a not oriented-polyethylene film having a thickness of 60 μm was subjected to the convert to the composite covering layer in place of the laminate structure consisting of the oriented nylon film having a thickness of 15 μm and the not oriented-polypropylene film having a thickness of 70 μm.

The vapor-deposited film thus obtained exhibited a satisfactory transparency. Also, the oxygen permeability and the mechanical strength of the laminate structure were measured in respect of the obtained vapor-deposited film. Table 3 shows the results.

EXAMPLE 17

A vapor-deposited film was obtained as in Example 8, except that a biaxially oriented nylon ($ON_y$) film having a thickness of 15 μm was used as the substrate, and a not oriented-polyethylene film having a thickness of 60 μm was subjected to the convert to the composite covering layer in place of the laminate structure consisting of the oriented nylon film having a thickness of 15 μm and the not oriented polypropylene film having a thickness of 70 μm.

The vapor-deposited film thus obtained exhibited a satisfactory transparency. Also, the oxygen permeability and the mechanical strength of the laminate structure were measured in respect of the obtained vapor-deposited film. Table 3 shows the results.

EXAMPLE 18

A vapor-deposited film was obtained as in Example 9, except that a biaxially oriented nylon ($ON_y$) film having a thickness of 15 μm was used as the substrate, the atomic ratio of aluminum to oxygen of the vapor-deposited film was successively changed within a range of 1:2 to 1:1 from the side in contact with the substrate toward the surface of the vapor-deposited film, and a not oriented-polyethylene film having a thickness of 60 μm was subjected to the convert to the composite covering layer in place of the laminate structure consisting of the oriented nylon film having a thickness of 15 μm and not oriented polypropylene film having a thickness of 70 μm.

The vapor-deposited film thus obtained exhibited a satisfactory transparency. Also, the oxygen permeability and the mechanical strength of the laminate structure were measured in respect of the obtained vapor-deposited film. Table 3 shows the results.

COMPARATIVE EXAMPLE 3

A vapor-deposited film was obtained as in Comparative Example 1, except that a biaxially oriented nylon ($ON_y$) film having a thickness of 15 μm was used as the substrate, and a not oriented-polyethylene film having a thickness of 60 μm was subjected to the convert to the composite covering layer in place of the laminate structure consisting of the oriented nylon film having a thickness of 15 μm and the not oriented polypropylene film having a thickness of 70 μm.

The oxygen permeability and the mechanical strength of the laminate structure were measured in respect of the obtained vapor-deposited film. Table 3 shows the results.

COMPARATIVE EXAMPLE 4

A vapor-deposited film was obtained as in Comparative Example 2, except that a biaxially oriented nylon ($ON_y$) film having a thickness of 15 μm was used as the substrate, the atomic ratio of aluminum to oxygen of the vapor-deposited film was successively changed within a range of 1:2 to 1:1 from the side in contact with the substrate toward the surface of the vapor-deposited film, and a not oriented-polyethylene film having a thickness of 60 μm was subjected to the convert to the composite covering layer in place of the laminate structure consisting of the oriented nylon film having a thickness of 15 μm and the not oriented-polypropylene film having a thickness of 70 μm.

The oxygen permeability and the mechanical strength of the laminate structure were measured in respect of the obtained vapor-deposited film. Table 3 shows the results.

TABLE 3

| | Self bias value V | Ed value V · sec/m² | Oxygen permeability ml/m² · day · MPa | Mechanical strength of laminate structure N/15 mm |
|---|---|---|---|---|
| Example 10 | 120 | 214 | 5.2 | 2.2 |
| Example 11 | 320 | 214 | 6.9 | 4.3 |
| Example 12 | 360 | 214 | 6.8 | 4.9 |
| Example 13 | 330 | 214 | 4.8 | 4.4 |
| Example 14 | 360 | 214 | 4.6 | 4.9 |
| Example 15 | 300 | 214 | 7.1 | 4.8 |
| Example 16 | 300 | 214 | 4.5 | 4.9 |
| Example 17 | 320 | 214 | 7.1 | 4.9 |
| Example 18 | 320 | 214 | 4.9 | 4.9 |
| Comparative Example 3 | 0 | 0 | 6.3 | 0.3 |
| Comparative Example 4 | 0 | 0 | 5.4 | 0.3 |

As apparent from Table 3, it was possible to obtain a sufficiently high mechanical strength of the laminate structure by using a biaxially oriented nylon ($ON_y$) film having a thickness of 15 μm as a substrate and by converting a not oriented polyethylene film having a thickness of 60 μm in place of the laminate structure consisting of the oriented nylon film having a thickness of 15 μm and a polypropylene film having a thickness of 70 μm, which was not oriented, although the oxygen permeability was rendered relatively high.

Table 3 also shows that it was possible to obtain a vapor-deposited film excellent in the gas barrier function and the water vapor barrier function by consecutively changing the atomic ratio of aluminum to oxygen of the vapor-deposited film within a range of 1:2 to 1:1 from the side in contact with the substrate toward the surface of the vapor-deposited film.

What is claimed is:

1. A vapor-deposited film comprising a film substrate consisting essentially of a polymer material and a vapor deposition layer formed in contact with the substrate and consisting essentially of a ceramic material, wherein the substrate is subjected to a plasma pretreatment before formation of the vapor deposition layer on the film substrate, by a special plasma using a hollow anode plasma processing apparatus, wherein said ceramic material is formed of at least one inorganic oxide comprising aluminum oxide having a gradient structure in terms of the atomic ratio of aluminum to oxygen such that said atomic ratio is consecutively changed within a range of 1:2 to 1:1 from the side in contact with said film substrate toward the surface of the vapor deposition layer.

2. The vapor-deposited film according to claim 1, wherein said hollow anode plasma processing apparatus is a magnetic assisted hollow anode plasma processing apparatus further comprising a magnet.

3. The vapor-deposited film according to claim 1, wherein the thickness of said vapor deposition layer is between 5 nm and 300 nm.

4. The vapor-deposited film according to claim 1, wherein said plasma pretreatment is a low temperature plasma treatment carried out by using at least one gas selected from the group consisting of argon nitrogen oxygen and hydrogen, under the conditions that the self bias value is between 200V and 2,000V, and the Ed value defined by "Ed=plasma density x processing time" is between 100 (V·s·m$^{-2}$) and 10,000 (V·s·m$^{-2}$).

5. The vapor-deposited film according to claim 1, wherein said plasma pretreatment includes a first processing using an inert gas, followed by a second processing, using at least one gas selected from the group consisting of nitrogen oxygen hydrogen, and a mixture thereof.

6. The vapor-deposited film according to claim 5, wherein said inert gas is at least one selected from the group consisting of argon and helium.

7. The vapor-deposited film according to claim 1, wherein said plasma pretreatment includes a first processing using a mixed gas consisting of nitrogen and oxygen, followed by a second processing using hydrogen.

8. The vapor-deposited film according to claim 1, wherein said polymer material is at least one polymer selected from the group consisting of polyethylene, polypropylene, polyamides, polyesters, polycarbonate, polyacrylonitrile, polystyrene, polyvinyl chloride, cellulose, triacetyl cellulose, polyvinyl alcohol, polyurethanes and polymers having chemically modified bodies thereof.

9. The vapor-deposited film according to claim 8, wherein said polyesters include at least one polymer selected from the group consisting of polyethylene terephthalate, polyethyfene naphthalate, polybutylene terephthalate, polybutylene naphthalate and copolymers thereof.

10. The vapor-deposited film according to claim 1, further comprising a composite covering layer formed on said vapordeposited film by using at least one material selected from the group consisting of a hydroxyl group-containing polymer compound, a metal alkoxide, a hydrolysate of the metal alkoxide, and a mixture of the hydrolysate of the metal alkoxide and the hydroxyl group-containing polymer compound.

11. The vapor-deposited film according to claim 10, wherein said hydroxyl group-containing polymer compound is selected from the group consisting of polyvinyl alcohol, poly(vinyl alcohol-co-ethylene), cellulose and starch.

12. The vapor-deposited film according to claim 10, wherein said metal alkoxide is a silicon alkoxide.

13. The vapor-deposited film according to claim 1, wherein said plasma pretreatment and the vapor deposition of aluminum oxide are carried out consecutively within the same film-forming apparatus without breaking the vacuum.

14. A vapor-deposited film comprising a film substrate consisting essentially of a polymer material and a vapor deposition layer formed in contact with the film substrate and consisting essentially of aluminum oxide, wherein the film substrate is subjected to a plasma pretreatment before formation of the vapor deposition layer on the film substrate and that the aluminum oxide layer formed by the vapor deposition has a gradient structure in terms of an atomic ratio of aluminum to oxygen from the side in contact with the film substrate toward the surface of the aluminum oxide layer, wherein said atomic ratio of aluminum to oxygen is changed within a range of 1:2 to 1:1 from the side in contact with the substrate toward the surface of said aluminum oxide layer.

15. The vapor-deposited film according to claim 14, wherein said plasma pretreatment is a high frequency plasma treatment.

16. The vapor-deposited film according to claim 14, wherein said polymer material is at least one polymer selected from the group consisting of polyethylene, polypropylene, polyamides, polyesters, polycarbonate, polyacrylonitrile, polystyrene, polyvinyl chloride, cellulose, triacetyl cellulose, polyvinyl alcohol, polyurethanes and polymers having chemically modified bodies thereof.

17. The vapor-deposited film according to claim 16, wherein said polyesters include at least one polymer selected from the group consisting of polyethylene terephthalate, polyethylene naphthalate, polybutylene terephthalate, polybutylene naphthalate and copolymers thereof.

18. The vapor-deposited film according to claim 14, further comprising a composite covering layer on said vapor-deposited film, by using at least one material selected from the group consisting of a hydroxyl group-containing polymer compound, a metal alkoxide, a hydrolysate of the metal alkoxide, and a mixture of the hydrolysate of the metal alkoxide and the hydroxvl group-containing polymer compound.

19. The vapor-deposited film according to claim 18, wherein said hydroxyl group-containing polymer compound is selected from the group consisting of polyvinyl alcohol, poly(vinyl alcohol-co-ethylene), cellulose and starch.

20. The vapor-deposited film according to claim 18, wherein said metal alkoxide is a silicon alkoxide.

21. The vapor-deposited film according to claim 14, wherein said plasma pretreatment and the vapor deposition of aluminum oxide are carried out consecutively within the same film-forming apparatus without breaking the vacuum.

* * * * *

UNITED STATES PATENT AND TRADEMARK OFFICE
CERTIFICATE OF CORRECTION

| | | |
|---|---|---|
| PATENT NO. | : 7,112,370 B2 | Page 1 of 1 |
| APPLICATION NO. | : 10/760483 | |
| DATED | : September 26, 2006 | |
| INVENTOR(S) | : Hiroshi Suzuki et al. | |

It is certified that error appears in the above-identified patent and that said Letters Patent is hereby corrected as shown below:

On the Title page:

Item (56) References Cited, Other Publications, Col. 2, line 2, change "PCT/JPO2/07432." to --PCT/JPO2/07432,--

In the claims

Claim 9 Col. 18, lines 27-28, change "polyethyfene" to --polyethylene--

Claim 10 Col. 18, line 32, "vapordeposited" to --vapor-deposited--

Claim 18 Col. 19, line 13, change "film," to --film--

Claim 18 Col. 20, line 2, change "hydroxvl" to --hydroxyl--

Signed and Sealed this

First Day of May, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,112,370 B2 | Page 1 of 1 |
| APPLICATION NO. | : 10/760483 | |
| DATED | : September 26, 2006 | |
| INVENTOR(S) | : Hiroshi Suzuki et al. | |

It is certified that error appears in the above-identified patent and that said Letters Patent is hereby corrected as shown below:

On the Title page:

Item (56) References Cited, Other Publications, Col. 2, line 2, change "PCT/JPO2/07432." to --PCT/JPO2/07432,--

In the claims

Col. 18, lines 27-28, change "polyethyfene" to --polyethylene--

Col. 18, line 32, "vapordeposited" to --vapor-deposited--

Col. 19, line 13, change "film," to --film--

Col. 20, line 2, change "hydroxvl" to --hydroxyl--

Signed and Sealed this

Fifteenth Day of May, 2007

JON W. DUDAS
*Director of the United States Patent and Trademark Office*